(12) United States Patent
Gärtner

(10) Patent No.: US 7,323,254 B2
(45) Date of Patent: Jan. 29, 2008

(54) LAYERED MATERIAL

(75) Inventor: Walter Gärtner, Gmunden (AT)

(73) Assignee: Miba Gleitlager GmbH, Laakirchen (AT)

(*) Notice: Subject to any disclaimer, the term of this patent is extended or adjusted under 35 U.S.C. 154(b) by 225 days.

(21) Appl. No.: 10/872,302

(22) Filed: Jun. 18, 2004

(65) Prior Publication Data
US 2005/0003225 A1 Jan. 6, 2005

(30) Foreign Application Priority Data
Jul. 1, 2003 (AT) .................. A 1001/2003

(51) Int. Cl.
B32B 15/01 (2006.01)
B32B 15/18 (2006.01)
B32B 15/20 (2006.01)
F16C 32/00 (2006.01)

(52) U.S. Cl. .................. 428/610; 428/615; 428/650; 428/668; 384/625; 384/627

(58) Field of Classification Search .................. None
See application file for complete search history.

(56) References Cited

U.S. PATENT DOCUMENTS

| 5,209,578 A * | 5/1993 | Eastham et al. ............. 384/276 |
| 5,545,489 A * | 8/1996 | Tanaka et al. ............... 428/629 |
| 5,817,397 A * | 10/1998 | Kamiya et al. .............. 428/141 |
| 6,309,759 B1 * | 10/2001 | Tomikawa et al. .......... 428/642 |
| 6,357,919 B1 * | 3/2002 | Kawachi et al. ............ 384/276 |
| 6,479,101 B2 | 11/2002 | Gartner |
| 6,575,635 B1 * | 6/2003 | Tsuji et al. .................. 384/276 |
| 6,863,441 B2 * | 3/2005 | Kawachi et al. ............ 384/276 |
| 2004/0187639 A1 * | 9/2004 | Kobayashi ................... 75/246 |
| 2004/0241489 A1 * | 12/2004 | Kawachi et al. ............ 428/642 |
| 2006/0134453 A1 * | 6/2006 | Kuwabara et al. .......... 428/658 |

FOREIGN PATENT DOCUMENTS

| AT | 408 102 | 9/2001 |
| DE | 26 13 318 | 10/1977 |
| DE | 199 63 385 | 1/2001 |
| DE | 100 56 579 | 5/2002 |
| EP | 0 435 980 | 8/2000 |
| GB | 2270927 | 3/1994 |

OTHER PUBLICATIONS

Zimmerman et al, *Metallurgie und Werkstofftechnik*, publ. by VEB Deutscher Verlag fuer Grundstoffindustrie, pp. 293 and 352.

* cited by examiner

*Primary Examiner*—Jennifer C. McNeil
*Assistant Examiner*—Jason L. Savage
(74) *Attorney, Agent, or Firm*—Collard & Roe, P.C.

(57) ABSTRACT

The invention relates to an alloy consisting of at least three components A, B, C, which form at least a first matrix and a soft phase dispersed therein, with a first surface (5) and a second surface (9) lying opposite it, the proportions of components A, B, C in the alloy being different from one another in the regions of the first (5) and the second surface (8). At least one of the components forms a hard phase and at least one of the other components forms another matrix different from the first matrix, the first matrix being disposed at least in the region of the first surface (5) and the other matrix being disposed at least in the region of the second surface (8), whilst the hard phase is dispersed through both the first and the other matrix.

15 Claims, 2 Drawing Sheets

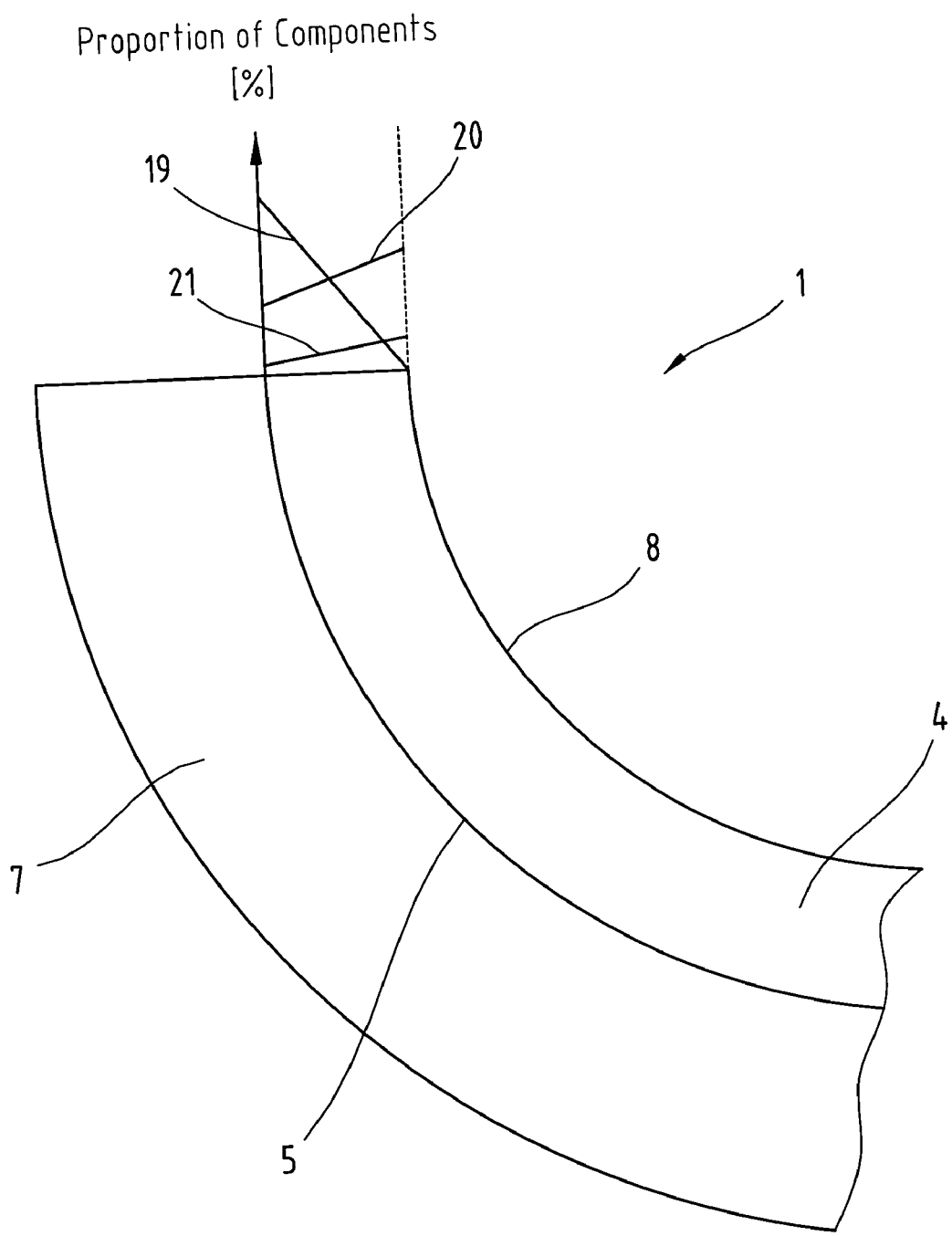

LAYERED MATERIAL

BACKGROUND OF THE INVENTION

1. Field of the Invention

The invention relates to an alloy consisting of at least three components A, B, C, which form at least a first matrix and a soft phase dispersed therein, with a first surface and a second surface disposed on top of it, the proportions of components A, B, C in the regions of the first and second surfaces being different from one another, an overlay formed therefrom, a composite material consisting of at least two different layers, a method of producing the overlay by depositing the components on a substrate whereby the quantity of the individual components deposited is adjusted by controlling the deposition input put power, as well as the use of the alloy.

2. The Prior Art

Very high demands are made of modern anti-friction bearings in terms of their capacity to withstand heat and mechanical stress, reliability and anti-friction properties. This being the case, multi-layered materials which usually have a structure comprising steel backing-bearing metal layer-running layer, optionally with intermediate layers disposed in between as diffusion barriers, have proved to be very effective because the properties required are often conflicting and single-layered bearings can only offer these to a greater or lesser degree by striking a compromise, if at all. The properties of the individual layers therefore depend on the desired application and have long been known to the person skilled in the art. Amongst other things, the running layer itself must adhere well to the bearing metal layer, must be adapted to the other bearing materials, must be capable of embedding foreign particles resulting from abrasion, exhibit a high resistance to wear and be thermally stable. However, precisely this mix of properties poses a problem because the ability to embed requires a somewhat softer material whereas, conversely, the ability to withstand wear requires a harder material.

In order to take account of these aspects, patent specification EP 0 435 980 B2, for example, proposes an axial bearing obtained by depositing a coating on a stiffening material by cathodic sputtering, in which the coating is a first material comprising the coating matrix and a soft phase of a second material dispersed therein. The content of dispersed soft phase varies continuously from a low content at the interface with the bearing material to a high content at the coating surface.

SUMMARY OF THE INVENTION

The objective of the invention is to propose an alloy and a coating for a bearing element, in particular a sputter coating for a plain bearing, with improved properties and in particular better wear resistance.

This objective is achieved by the invention—in each case independently—by an alloy of the type mentioned above, in which at least one of the components forms a hard phase and at least one of the other components forms another matrix which is different from the first matrix, the first matrix being disposed at least in the region of the first surface and the other matrix being disposed at least in the region of the second surface, and the main phase is dispersed through both the first and the other matrix, and by means of a bearing layer made from the alloy and a multi-layered material incorporating the bearing layer, as well as a method in which the deposition input power for each component is controlled independently so that at least one of the components forms a hard phase and at least one of the other components forms another matrix different from the first matrix, the first matrix being disposed at least in the region of the first surface and the other matrix being disposed at least in the region of the second surface, whilst the main phase is dispersed through both the first and the other matrix, and the use of the alloy to produce a plain bearing and a thrust ring.

The advantage of this approach is that this alloy and the layers made from it are relatively hard and are therefore able to withstand stress accordingly. On the other hand, the tribological properties are rendered more "compatible" for use in bearings due to the structure of the alloy or coating proposed by the invention, i.e. the problems of spontaneous failure which occur in standard sputter bearings due to the fact that at least parts of the sputter coatings melt due to the build-of heat which they are required to withstand, are avoided, at least to a large degree. The situation where crystallisation seeds formed by the hard phase are also present in the other matrix and lead to a significant increase in the grain size of the soft phase, such as occurs in the prior art due to varying solely the proportion of soft phase through the cross section of the layer, is avoided. In addition, the fact that the hard phase is also present in the other matrix improves the wear resistance of a running coating on a bearing made from the alloy in the regions of the running layer facing the elements to be supported. Consequently, the properties of the running and bearing layers can be adapted to meet the respective requirements by controlling the quantities of components deposited accordingly. This enables sputter-coated running layers for bearings to be obtained which have properties at the surface where they co-operate with the other bearing component that are different from those at the surface where they are joined to other layers, such as a backing layer or bearing metal layer, for example. As a result of the invention, the positive properties of one matrix component in conjunction with one or more alloy components can be combined with positive properties of another matrix component with one or more alloy components within the running layer proposed by the invention. Depending on the requirements demanded of the overlay, the component desired throughout the cross section may be the first matrix, the hard phase or soft the phase and can be deposited in the desired quantity, which means that the role of the alloy components is reversed, for example the hardener of the matrix becomes the hardener of the soft phase.

In one embodiment, one alloy system AB changes into an alloy system BC or AC starting from the first surface and extending towards the second surface, which is achieved by controlling the deposited quantity of individual components accordingly during the deposition process. Consequently, an alloy with sharply contrasting properties can be produced, in which case a minority component of the "initial alloy" becomes the matrix component of another alloy system during the coating process.

It is of advantage if the transition from one alloy system to another alloy system or from one matrix to the other matrix is at least substantially constant, e.g. the deposited quantity of the component (s) is continuously varied so that there is no abrupt change but instead a uniform and constant change in the properties of the alloy and the overlay.

The other matrix may be the soft phase so that a high proportion of these soft phases is present in the boundary regions of an anti-friction layer with the elements to be supported, which improves the capacity of the alloy to adapt to or embed foreign particles, but the hardness of this boundary area nevertheless does not fall below a specific desired value due to the presence of a hard phase, at least in a part-region—as viewed through the cross section in the direction from the first to the second surface.

The method can also be controlled in order to produce an alloy in which the first matrix is present exclusively in the region of the first surface and, in one embodiment of the invention, the region of the first surface may have a thickness in the range of from 2 µm to 5 µm, preferably from 3 µm to 4 µm, so that a diffusion barrier for the elements of the overlay layer and elements of a layer adjoining it or a bonding layer can be provided.

Likewise, the method may be controlled in such a way that the other matrix is disposed exclusively in the region of the second surface, in which case the region of the second surface may have a thickness in the range of from 2 µm to 5 µm, preferably from 3 µm to 4 µm, thereby imparting better anti-seizure properties to the anti-friction layer, or a bearing metal layer and a running layer can optionally be deposited during the process sequence.

In one embodiment, the first matrix is an element selected from a group of elements consisting of Ag, Al, Cu, Fe because these elements have the right balance of properties for making anti-friction bearings, combined with the fact that they are inexpensive. They are sufficiently tough and have good heat conducting properties, which means that the problem of over-heating mentioned above is avoided because any heat which builds up is at least partially dissipated.

The other matrix, in particular the soft phase, may also be made from at least one element selected from a group of elements consisting of Bi, C, In, Pb, Sn, Sb. The advantage of this is that these elements are relatively soft and the overlay can therefore be effectively adapted to the other anti-friction element during running in and also has the appropriate anti-seizure properties.

In other embodiments of the invention, the hard phase is made from at least one element from a group of elements consisting of Ag, Al, Fe, Cu, Ni, Sc, Si, Zn, Mn, Co, Cr, Zr, Mg and/or inter-metallic phases of these elements, because this advantageously makes it possible to increase the hardness and hence the stability of the overlay by various hardness mechanisms and impart a well-balanced range of properties to the alloy, e.g. improved heat resistance by using Co and Cr amongst others, improved structural strength by incorporating Fe.

In another embodiment of the invention, the hardness at the first surface may have a Vickers value in the range of between 140 HV0,001 and 250 HV0,001, in particular between 160 HV0,001 and 230 HV0,001, since this will ensure that the overlay has the corresponding structural strength.

It is also of advantage if the hardness at the second surface has a Vickers value in the range of between 30 HV0,001 and 130 HV0,001, in particular between 40 HV0,001 and 120 HV0,001, thereby maintaining the capacity to embed foreign particles.

It is also of advantage if the mean grain size of the first surface through to the second surface remains at least substantially constant or decreases, since this will mean that the roughness on the surface will also remain constant or decrease, which has positive implications for the sliding behaviour of the overlay layer. The other advantage of this is that cavity formation, due to the soft phase "melting out" if the anti-friction layer is exposed to excessive temperatures, can be avoided to a greater degree and the resultant cavities will be of smaller dimensions.

The overlay may be made by a sputtering process, thereby providing the user with a very high-quality bearing.

For the reasons mentioned above, it is also of advantage if at least one surface of the anti-friction layer has a surface roughness $R_z$ in the range of between 0.8 µm and 6.5 µm, in particular between 1.4 µm and 4.5 µm.

In another embodiment of the composite material, another layer may be provided as a backing layer, in particular made from steel, in which case the overlay may specifically have a Vickers hardness in the range of between 120 HV0,001 and 250 HV0,001, in particular between 140 HV0,001 and 230 HV0,001, thereby enabling mechanical forces acting on the overlay to be dissipated and absorbed, whilst achieving a high mechanical stability. Another advantage is the fact that a high-strength composite material can be produced at low cost and without any problems during processing. To this end, an appropriate substrate is used for the method proposed by the invention.

In one embodiment of the method, components A, B, C are deposited on the substrate using a PVD process, in particular a sputtering process. The advantage of this is that this method constitutes a relatively simple process to run and produces deposited layers of a high quality.

Another advantage is the fact that the deposited quantity can be varied at least substantially continuously during the deposition process, thereby avoiding an abrupt change and instead achieving a uniform and constant variation in the properties of the overlay.

By controlling the quantity of hard phase, the hardness of the other matrix in the region of the second surface can be adjusted, the advantage of which is that the hardness can be adjusted to suit every application.

It is also of advantage if the deposited quantity of the individual components is controlled so that mixing gaps in the alloy system made up of components ABC are avoided, as a result of which final concentrations of the alloy can be achieved which would otherwise not be possible by the direct route due to the mixing gaps.

The proportion of hard phase in the alloy relative to the first and/or other matrix may be regulated during the deposition process so that the mean grain size of the soft phase remains at least substantially the same or decreases from the first surface to the second surface.

Finally, it is also of advantage that the deposited quantity or deposition power input can be controlled on an automated basis, thereby enabling a process to be run to exact specifications and on a reproducible basis.

BRIEF DESCRIPTION OF THE DRAWINGS

To provide a clearer understanding of the invention, it will be explained in more detail with reference to the appended drawings. The simplified, schematic diagrams are as follows:

FIG. 3 plots the proportions of components in the alloy through the cross section of the overlay and the backing layer.

DETAILED DESCRIPTION OF THE INVENTION

Figure 1:
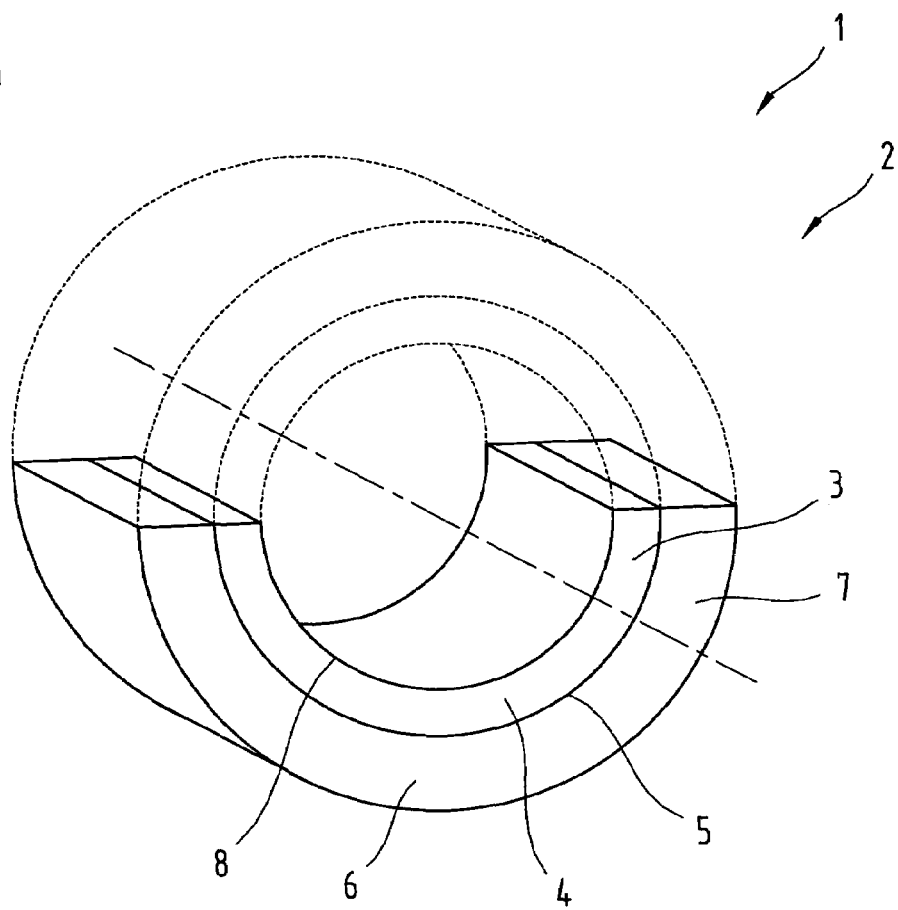
FIG. 1 illustrates an overlay joined to a backing layer in an anti-friction bearing, in the form of a half-shell.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc,. relate to the drawing specifically being described and can be transposed in terms of meaning to a new position when another position is being described. Individual features or combinations of features from the different embodiments illustrated and described may be construed as independent inventive solutions or solutions proposed by the invention in their own right.

FIG. 1 is a schematic diagram illustrating a bearing element 1, e.g. a plain bearing 2, with an anti-friction layer 3 constituting the overlay 4 made from the alloy proposed by the invention. At a first surface 5, the overlay 4 is joined to a functional layer 6 so that it is prevented from moving. The functional layer 6 may be a backing layer 7 or base shell. The backing layer 7 is usually made from a metal material, for example steel, and is designed to absorb and dissipate at least some of the forces transmitted by a shaft via a second surface 8 to the overlay 4. Instead of using steel as the material for the backing layer 7, however, it would also be possible to use other materials with similar characteristic values.

It would likewise be possible to provide another functional layer between the backing layer 7 and the overlay 4 (not illustrated), which may serve to impart adhesion, for example.

As may be seen from FIG. 1, the bearing element 1 is a half-shell. It would naturally also be possible to work with other variants such as full shells incorporating the overlay 4 proposed by the invention and the composite material proposed by the invention, as indicated by broken lines in FIG. 1. Similarly, thrust rings, for example, could also be provided with the overlay 4. It should be pointed out at this stage that the bearing illustrated in FIG. 1 is one with only two layers but the invention specifically relates to multilayered bearings generally, e.g. bearings with three layers.

Figure 2:
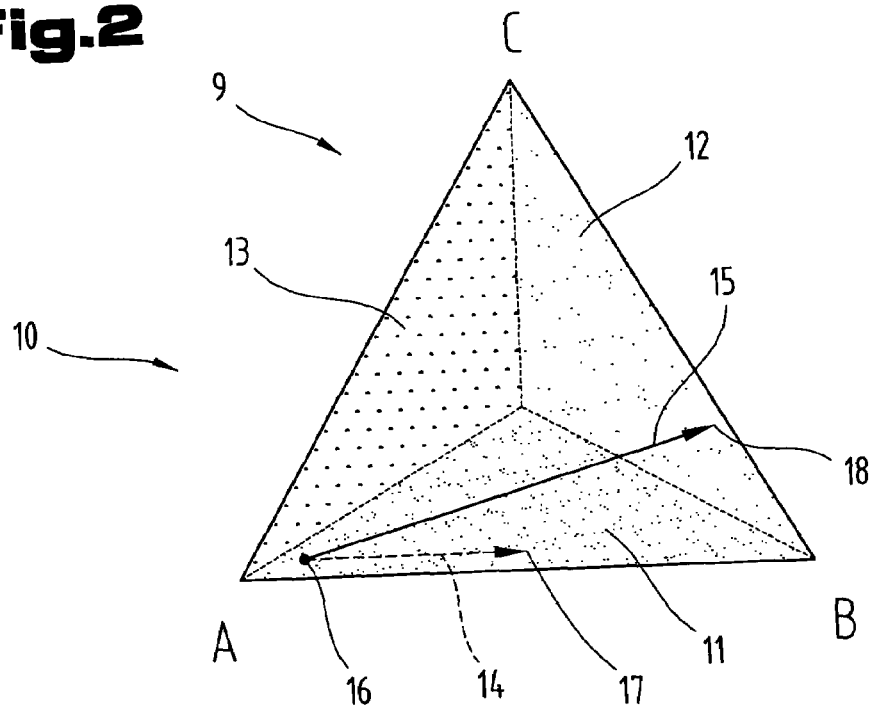
FIG. 2 is a projection of a concentration-temperature prism of a general ternary phase diagram for an overlay as proposed by the invention.

The overlay 4 proposed by the invention is made from an alloy, the composition of which varies, starting from the first surface 5, in the direction towards the second surface 8, i.e. the proportion of the components contained in it varies, as illustrated in FIG. 2. The overlay 4 proposed by the invention may be produced using a PVD process, for example a sputtering process or a vapour deposition process. It may also be produced by galvanic coating techniques, such as electrolytic deposition, for example.

FIG. 2 illustrates a projection in the direction of the temperature axis of a concentration-temperature prism of a ternary phase diagram 9 for the overlay 4 proposed by the invention in a general alloy system ABC 10. The three components A, B and C thus form the corner points of the equilateral triangle. The ternary phase diagram 9 has three binary alloy systems, namely binary system AB 11, system BC 12 and system AC 13.

It should be pointed out here that the term "component" as used in the context of the invention does not just relate to pure elements but should also be understood as meaning compounds and alloys of pure elements.

All the hardness values given were measured using Vickers micro-hardness measuring equipment with a test force of 0.001 kilopond, conforming to standard DIN EN ISO 6507-1 (1998-01-00) and the roughness measurements conform to DIN 4760.

FIG. 2 also gives an approximate curve for a first concentration gradient 14 known from the prior art and a second concentration gradient 15 representing the invention.

One alloy in a bearing known from the prior art has an initial composition on one side of a functional layer, for example, in which the quantities are 90% A, 10% B, for example.

These and all other percentages represent percentages by weight.

To provide a better comparison of the prior art with the invention, the initial composition 16 of the alloy taken as an example additionally contains a small quantity of a component C and the initial composition 16 is therefore made up of 89% A, 9% B and 2% C.

This initial composition 16 is disposed at the first surface 5 of the overlay 4, for example. Component A, being the matrix-forming component, may be aluminium, for example, whilst component B serves as a soft phase and has tin dispersed through it. The remainder may be small quantities of other elements used as a means of varying the hardness of the overlay 4, for example. As explained above, in view of the fact that the overlay 4 is required to meet different needs at different parts of its cross section, for example because good running-in behaviour is needed at the second surface 8 whilst the first surface 5 must have mechanical stability, the approach taken by the prior art is to vary the initial composition 16 of the alloy through the cross section of the overlay 4 so as to achieve a first end composition 17 in the region of the second surface 8 (FIG. 1), conforming to the first concentration gradient 14. The first end composition 17 in this example consists of approximately 49% A, 49% B and 2% C. This variation essentially corresponds to an increase in the proportion of soft phase, as a result of which the layer hardness decreases and the grain size of the soft phase increases. However, resistance to wear is reduced simultaneously.

In the case of the alloy proposed by the invention, as may be seen in FIG. 2 for example, again starting with an initial composition 16, the content of the components through the cross section of the overlay 4 varies in accordance with the second concentration gradient 15. The initial composition 16 of the overlay 4 at the first surface 5 consists of 89% of component A as the first matrix, preferably being an element selected from a group of elements consisting of Ag, Al, Cu, Fe, 9% of component B as the soft phase former, in particular an element selected from a second group of elements consisting of Bi, C, In, Pb, Sn, Sb, and 2% of component C as the hard phase former, being at least one element selected from a third group of elements consisting of Ag, Al, Fe, Cu, Ni, Sc, Si, Zn, Mn, Co, Cr, Zr, Mg.

At this stage, it should be pointed out that the elements listed above are not intended to restrict the scope of the invention in any way but are given merely to illustrate the thinking behind the invention, in other words, the change that can be achieved from a first matrix to another matrix within the alloy can also be achieved with other combinations of elements.

During the course of producing the overlay 4, the composition varies along the second concentration gradient 15, for example, until a second end composition 18 is obtained. This being the case, it is preferable if, in the ternary alloy system ABC 10, there is a transition in the composition of the overlay 4 from the binary alloy system AB 11 to another binary alloy system BC 12, as illustrated in FIG. 2. Consequently, the overlay 4 has the end composition 18 at the second surface 8, containing 3% of component A, 80% of component B and 17% of component C.

Accordingly, in addition to fulfilling its function as the soft phase in the first matrix at the first surface 5, component B additionally assumes the function of the other matrix at the second surface 8.

Component C changes from its function as a hard phase former in the first matrix to the hard phase former of the other matrix.

It should be pointed out that the terms "hard phase" and "hard phase former" are intended to mean all hardening and solidification mechanisms, such as mixed crystal solidification or particle solidification for example, including the formation of intermetallic phases with the other elements contained in the alloy system ABC 10, and thus describes the main function of the respective element, although this is not intended to exclude other property changes caused by the element.

The transition from the initial composition 16 to the second end composition 18 takes place at least substantially continuously for the purposes of the invention, preferably by automated control of the deposition input power and deposition quantities of the individual components in a sputtering process. By "at least substantially continuously" is meant that no abrupt variations are discernible in the composition of the overlay using conventional light microscopy test methods.

In one option, it may be that only the component for the first matrix is deposited to a thickness of 4 µm, preferably to 3 µm, for example, in a region of the overlay 4 at the first surface 5, so that it can act as a diffusion barrier for the adjoining functional layer 6 or backing layer 7, or as a means of imparting adhesion.

Component A of the alloy and overlay 4 may be made up of elements from the group of elements listed above in a total quantity of 45% to 100% max., preferably between 55% and 95%, in particular between 60% and 95%.

A proportion of 100% is possible for the purposes of the invention if, as mentioned in the previous paragraph, for example, pure elements are deposited first of all in order to prevent diffusion or to impart adhesion.

Component B of the alloy and overlay 4 may be made up of elements from the group of elements listed above, in a total quantity of 45% to 100% max., preferably between 55% and 95%, in particular between 60% and 95%.

The main phase of the alloy and overlay 4 may contain elements from the group of elements listed above in a total quantity of 0.001% to 20% max., preferably between 0.005% and 18%, in particular between 0.01% and 17%.

Depending on which components are used, the overlay 4 at the first surface 5 may have a Vickers hardness in the range of between 140 HV0,001 and 250 HV0,001, in particular between 160 HV0,001 and 230 HV0,001.

Furthermore, the overlay 4 at the second surface 8 may have a Vickers hardness in the range of between 30 HV0,001 and 130 HV0,001, in particular between 40 HV0,001 and 120 HV0,001.

On the one hand, this will produce the requisite stability of the overlay 4 at the first surface 5 and, on the other hand, the overlay 4 at the second surface 8 will be soft enough to embed foreign particles in spite of exhibiting a high strength for example, thereby improving wear resistance as compared with the alloys known from the prior art.

The invention enables the mean grain size of the soft phase through the cross section of the overlay 4 from the first surface 5 through to the second surface 8 to remain at least substantially constant or decrease, because crystallisation seeds present as a result of the hard phase will prevent an increase in the grain size of the soft phase towards the second surface 8. In addition, the wear resistance of the overlay 4 is higher than is the case with the prior art because of the additional hard phase present in the region of the second surface 8.

The method of producing the coating will be explained in more detail taking the example of an Al—Sn—Cu alloy system.

As mentioned above, the overlay 4 proposed by the invention may be produced using a sputtering process. The physical-chemical processes which take place during sputtering have long been known and will not be described in detail here.

As proposed by the invention, three bar cathodes (targets) of differing compositions are disposed at the centre of the sputtering chamber, each of these cathodes consisting of one of the component A, B or C. In this specific example of an alloy system ABC 10, which is not intended to be restrictive, one cathode of component A is an AlCu2 alloy, a cathode of component B is pure copper and a cathode of component C is pure tin. Two bearing half-shells or substrates, for example backing layers 7, are disposed in a retaining device which rotates around the cathodes. However, it would likewise be possible to place bearing half-shells on a rotating device with several planar cathodes distributed around the rotating device. The deposited quantity of the individual component is controlled on an automated basis by means of the deposition power input, for example by means of electrical energy. For other possible arrangements of the targets and bearing shells, reference may be made to the relevant parts of the disclosures made in patent specification AT 408 102 B by the same applicant.

The sputter chamber is evacuated to approximately $1 \times 10^{-5}$ mbar and then filled with argon to obtain a pressure of approximately $5 \times 10^{-3}$ mbar. In order to clean the substrate surface, an etching process (inverse sputtering) is run for approximately 20 minutes at a power of 3 kW. The target shutters (screens) are closed during this process. After cleaning, the automated system then runs the following programme.

At the start of the sputtering process at instant t=0, power is applied to cathode B only and is so at a rate of 10 kW, whilst cathodes A and C are switched off. As a result, the first layer on the substrate is pure copper, which is deposited to a total thickness of approximately 3 µm and serves as a diffusion barrier and/or to impart adhesion. The process of increasing the power at cathode A is started simultaneously.

After t=5 min, the power at cathode A reaches 10 kw, cathode B is powered to 500 W and cathode C remains switched off. As a result, an increasing amount of aluminium and AlCu2 is deposited, thereby assuming the role of the first matrix in the alloy system AB 11.

Copper thus assumes the role of the hard phase former.

After t=7 min, cathode A is then set to 10 kW, cathode B is switched off and the power to cathode C is increased to 300 W, Consequently, an alloy of AlSn20Cu is deposited, in which tin constitutes the soft phases.

After a time t=100 min finally, cathode A is switched off, the power to cathode B increased to 100 W and cathode C powered with 1.5 kW. Accordingly, an alloy of SnCu6 is deposited and tin forms the other matrix and copper the hard phase.

Apart from the pure copper layer at the start, this resulted in a transition in the composition of the alloy or overlay 4 with an aluminium matrix and copper as the hardener element in the region of the first surface 5 to a composition with a tin matrix and copper as the hardener element in the region of the second surface 8.

The invention will be explained in more detail taking the example of a Al—Sn—Cu system.

The basic procedures, e.g. cleaning and the layout of the cathodes and bearing shells, are the same as those described in respect of the first example.

The first cathode of component A is pure copper, a cathode of component B consists of 99.5% aluminium and a cathode of component C consists of pure tin.

The deposition quantities of the individual components are controlled on an automated basis by means of the deposition power input, for example by means of electrical energy.

At the start of the sputtering process at instant t=0, power is applied at 10 kW to cathode A only, whilst cathodes B and C remain switched off. Simultaneously, the power to cathode B starts to rise.

As a result, a coating of pure copper is deposited to a total thickness of approximately 1 μm on the substrate, this layer serving as a diffusion barrier and/or to impart adhesion.

In the period t=7 min, the power to cathode A is reduced to 260 W, the power to cathode B is increased to 10 kW and cathode C remains switched off.

As a result, an increasing amount of aluminium and AlCu5 is deposited and thus assumes the role of the first matrix in the alloy system AB 11.

After t=21 min, cathode A is switched off, the power to cathode B is increased to 10 kW and the power to cathode C raised to 380 W. Accordingly, an AlSn20 alloy is deposited, in which tin forms the soft phases.

After a time t=91 min, finally, the power to cathode A is increased to 140 W, cathode B is switched off and the power to cathode C is 1.55 kW. Accordingly, a SnCu6 alloy is deposited and tin forms the other matrix and copper the hard phase.

The total coating thickness in this particular example is approximately 23 μm.

The transitions or change in the individual deposition power input levels proposed by the invention are controlled on an automated basis for the purposes of the invention and are at least substantially constant.

FIG. 3 plots the proportions of components A, B, C through the cross section of the overlay 4 but, unlike the example described above, without a pure copper layer at the start of the deposition process.

A part of the bearing element 1 is illustrated, in which the outer layer is the backing layer 7. The overlay 4 borders on the backing layer 7 with its first surface 5. Also shown is the curve for a proportion A 19, a proportion B 20 and a proportion C 21. The curves need not be linear and may have one or more curves for the purposes of the invention.

The alloy system ABC 10 containing the Al, Cu, Sn described here is merely intended as an example and should not be construed as restrictive. Other examples would be the alloy system Cu, Pb, Ni, in which case copper would be the matrix at the first surface 5, with lead constituting the soft phases and nickel the hard phases, whilst at the second surface 8, lead replaces copper as the other matrix, as well as the alloy system Cu, Pb, Sn or also the system Cu, Bi, Sn.

As proposed by the invention, the deposition power is controlled in such a way that the second concentration gradient 15 is varied so as to avoid any mixing gaps which might otherwise occur in the alloy system ABC 10, thereby enabling a second end composition 18 to be obtained which would otherwise have been prevented due to immiscible areas. An example of this is the ternary system Cu—Pb—Ni.

The described examples illustrate possible variants of the alloy but it should be pointed out that the invention is not specifically restricted to the particular variants described here. Rather, various combinations of the individual variants would be possible and these possible variations would be within the reach of a person skilled in this field, given the teaching of the invention. Accordingly, all conceivable variants obtained by combining individual details of the described and illustrated variants would be possible and are included within the scope of the invention.

Finally, for the sake of good order, it should be pointed out that in order to provide a clearer understanding of the overlay 4 and the composite material, it and its constituent parts are illustrated to a certain extent out of scale and/or on an enlarged scale and/or on a reduced scale.

The objectives underlying the independent solutions proposed by the invention may be found in the description.

Above all, the embodiments of the subject matter illustrated in FIGS. 1; 2; 3 may be construed as independent solutions proposed by the invention in their own right. The objectives and associated solutions may be found in the detailed descriptions of these drawings.

LIST OF REFERENCE NUMBERS

1 Bearing element
2 Plain bearing
3 Anti-friction layer
4 Overlay
5 First surface
6 Functional layer
7 Backing layer
8 Second surface
9 Ternary phase diagram
10 Alloy system ABC
11 Alloy system AB
12 Alloy system BC
13 Alloy system AC
14 First concentration gradient
15 Second concentration gradient
16 Initial composition
17 First end composition
18 Second end composition
19 Proportion A
20 Proportion B
21 Proportion C

What is claimed is:

1. A bearing element comprising an anti-friction layer constituting an overlay composed of a composite consisting essentially of an alloy of at least three components A, B, C, component A forming a first matrix, component B forming a soft phase second matrix dispersed therein, and component C forming a hard phase, the overlay having a first surface and a second surface lying opposite thereto, the weight proportions of the components A, B, C in the regions of the first and the second surface being different from one another, the first matrix being disposed at least in the region of the first surface and the soft phase second matrix being disposed at least in the region of the second surface, whilst the hard phase is dispersed through both the first matrix and the soft phase second matrix, the weight proportion of component A decreasing and the weight proportion of each of the components B and C increasing from the region of the first surface to the region of the second surface.

2. Bearing element as claimed in claim 1, wherein the first matrix is disposed exclusively in the region of the first surface.

3. Bearing element as claimed in claim 1, wherein the soft phase second matrix is disposed exclusively in the region of the second surface.

4. Bearing element as claimed in claim 1, wherein the first matrix contains an element selected from a group of elements consisting of Ag, Al, Cu, Fe.

5. Bearing element as claimed in claim 1, wherein the soft phase second matrix is an element selected from a group of elements consisting of Bi, C, In, Pb, Sn, Sb.

6. Bearing element as claimed in claim 1, wherein the hard phase is at least one element selected from a third group of elements consisting of Ag, Al, Fe, Cu, Ni, Sc, Si, Zn, Mn, Co, Cr, Zr, Mg.

7. Bearing element as claimed in claim 6, wherein the hard phase comprises inter-metallic phases of said elements.

8. Bearing element as claimed in claim 1, wherein the mean grain size of the soft phase remains at least substantially constant or decreases from the first surface to the second surface.

9. Bearing element as claimed in claim 1, comprising at least two different layers, wherein one of the layers is said overlay.

10. Bearing element as claimed in claim 9, wherein an additional layer forms a backing layer.

11. Bearing element as claimed in claim 10, wherein the backing layer is steel.

12. Bearing element as claimed in claim 1, wherein the overlay at the first surface has a Vickers hardness in the range of between 140 HV0,001 and 250 HV0,001.

13. Bearing element as claimed in claim 1 constituting a plain bearing.

14. Bearing element as claimed in claim 1 constituting a thrust ring.

15. Bearing element as claimed in claim 1, wherein the overlay at the second surface has a Vickers hardness in the range of between 30 HV0,001 and 130 HV0,001.

* * * * *